US008921782B2

(12) United States Patent
Jiang et al.

(10) Patent No.: US 8,921,782 B2
(45) Date of Patent: Dec. 30, 2014

(54) TILT-IMAGING SCANNING ELECTRON MICROSCOPE

(71) Applicant: KLA-Tencor Corporation, Milpitas, CA (US)

(72) Inventors: Xinrong Jiang, Palo Alto, CA (US); Ichiro Honjo, San Jose, CA (US); Christopher Malcolm Stanley Sears, San Jose, CA (US); Liqun Han, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/846,548

(22) Filed: Mar. 18, 2013

(65) Prior Publication Data

US 2014/0151552 A1    Jun. 5, 2014

Related U.S. Application Data

(60) Provisional application No. 61/731,614, filed on Nov. 30, 2012.

(51) Int. Cl.
*H01J 37/28* (2006.01)
*H01J 37/26* (2006.01)

(52) U.S. Cl.
CPC .............. *H01J 37/263* (2013.01); *H01J 37/28* (2013.01)
USPC ............................ 250/307; 250/306; 250/311

(58) Field of Classification Search
CPC ................................ H01J 37/28; H01J 37/263
USPC ........................................ 250/306, 307, 311
See application file for complete search history.

(56) References Cited

U.S. PATENT DOCUMENTS

| 3,657,593 | A | | 4/1972 | Garrood et al. |
| 4,999,496 | A | | 3/1991 | Shaw et al. |
| 5,483,073 | A | * | 1/1996 | Benner .................. 250/311 |
| 5,606,261 | A | | 2/1997 | Golladay |
| 5,736,742 | A | | 4/1998 | Ochiai |

(Continued)

FOREIGN PATENT DOCUMENTS

| JP | 09-073871 | 3/1997 |
| JP | 2005-252022 | 9/2005 |

(Continued)

OTHER PUBLICATIONS

PCT International Search Report and Written Opinion of the International Searching Authority for Application No. PCT/US2013/071914, Mar. 21, 2014, 12 sheets.

*Primary Examiner* — Nicole Ippolito
*Assistant Examiner* — Wyatt Stoffa
(74) *Attorney, Agent, or Firm* — Okamoto & Benedicto LLP

(57) ABSTRACT

One embodiment relates to a tilt-imaging scanning electron microscope apparatus. The apparatus includes an electron gun, first and second deflectors, an objective electron lens, and a secondary electron detector. The first deflector deflects the electron beam away from the optical axis, and the second deflector deflects the electron beam back towards the optical axis. The objective lens focuses the electron beam onto a spot on a surface of a target substrate, wherein the electron beam lands on the surface at a tilt angle. Another embodiment relates to a method of imaging a surface of a target substrate using an electron beam with a trajectory tilted relative to a substrate surface. Other embodiments and features are also disclosed.

19 Claims, 9 Drawing Sheets

(56) References Cited

U.S. PATENT DOCUMENTS

| | | | |
|---|---|---|---|
| 5,981,947 A | 11/1999 | Nakasuji et al. | |
| 6,452,175 B1 | 9/2002 | Adamec | |
| 6,614,026 B1* | 9/2003 | Adamec | 250/398 |
| 6,864,482 B2* | 3/2005 | Sato et al. | 850/9 |
| 7,164,139 B1* | 1/2007 | Toth et al. | 250/396 ML |
| 7,355,174 B2* | 4/2008 | Sato et al. | 250/310 |
| 7,408,172 B2* | 8/2008 | Sato et al. | 250/398 |
| 7,531,799 B2* | 5/2009 | Kawasaki et al. | 250/311 |
| 2003/0010926 A1* | 1/2003 | Lanio | 250/396 R |
| 2004/0119022 A1* | 6/2004 | Sato et al. | 250/396 R |
| 2005/0285036 A1* | 12/2005 | Sato et al. | 250/310 |
| 2008/0042074 A1* | 2/2008 | Sato et al. | 250/396 R |
| 2008/0258060 A1* | 10/2008 | Frosien et al. | 250/310 |
| 2011/0108736 A1* | 5/2011 | Preikszas | 250/397 |
| 2012/0286158 A1* | 11/2012 | Sohda et al. | 250/307 |

FOREIGN PATENT DOCUMENTS

| | | |
|---|---|---|
| JP | 2005-310602 | 11/2005 |
| JP | 2010-010170 | 1/2010 |
| WO | 2012-112284 A2 | 8/2012 |

* cited by examiner

FIG. 1     100

TILT-IMAGING SCANNING ELECTRON MICROSCOPE

CROSS-REFERENCE TO RELATED APPLICATION(S)

The present application claims the benefit of U.S. Provisional Application No. 61/731,614, filed on Nov. 30, 2012, entitled "Apparatus of High Resolution Scanning Electron Microscopy (SEM) with Tilt Image-Forming Capabilities," the disclosure of which is hereby incorporated by reference.

BACKGROUND

1. Technical Field

The present invention relates to scanning electron microscopes and similar instruments.

2. Description of the Background Art

Conventional Critical-Dimension Scanning Electron Microscopes (CD-SEMs) and electron beam (e-beam) Defect Review instruments (eDRs) generally capture only planar information about the surface of a feature on a wafer. The depth information, such as from walls of the feature, are typically not obtained by such CD-SEMs and eDRs.

It is desirable to obtain depth information, in addition to planar information, about features on a substrate surface. Such depth information is useful both for critical dimension measurements and for defect review.

Note that the diagrams in the present application are presented for explanatory purposes and are not necessarily to scale.

SUMMARY

One embodiment relates to a tilt-imaging scanning electron microscope apparatus. The apparatus includes an electron gun, first and second deflectors, an objective electron lens, and a secondary electron detector. The first deflector deflects the electron beam away from the optical axis, and the second deflector deflects the electron beam back towards the optical axis. The objective lens focuses the electron beam onto a spot on a surface of a target substrate such that the electron beam lands on the surface at a tilt angle.

Another embodiment relates to a method of imaging a surface of a target substrate using an electron beam with a trajectory tilted relative to a substrate surface. The electron beam is first deflected away from the optical axis and then deflected back towards the optical axis. After the second deflection, the electron beam is focused onto a spot on a surface of a target substrate and lands on the surface at a tilt angle.

Other embodiments and features are also disclosed.

DETAILED DESCRIPTION

As discussed above in the Background section, conventional CDSEMs and eDRs generally capture only planar information in its imaging of a feature. Depth information relating walls of a feature are not typically captured by such instruments.

Prior e-beam instruments may capture depth information by tilting the electron beam that is scanned over the substrate surface. However, applicants have determined certain problems and disadvantages with such prior instruments. For example, a simple magnetic or electrostatic deflection so that the trajectory of the e-beam becomes tilted relative to the surface lowers the resolution achievable by the instrument.

There are many sources of aberrations which are due to the deflection of the incident beam that limit or detract from the resolution of a tilt-imaging SEM. The sources of aberrations include coma, astigmatism, field curvature, and chromatic aberration. As part of the development of the present invention, applicants have determined that it is desirable for a solution to focus on correcting chromatic aberration, rather than the other sources.

Figure 1:
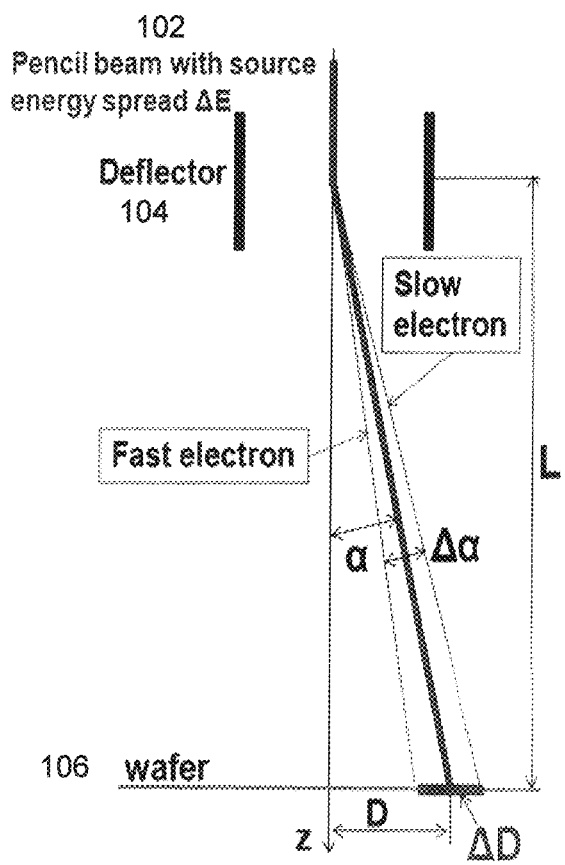
FIG. 1 depicts a simple deflection of an e-beam to form a tilt image.

FIG. 1 depicts a simple deflection of an e-beam to form a tilt image. Shown is how the deflection causes severe dispersive blur. For simplification purposes, let us assume that the e-beam is a "pencil" beam 102 which has a zero convergence angle, i.e. the beam has a numerical aperture (NA) of zero. As such, the coma, astigmatism and field curvature due to the deflection in FIG. 2 become zero due to their proportionality to the NA (astigmatism and field curvature) or the square of NA (coma). This simplification allows the following discussion to focus on the chromatic aberration caused by the energy dispersion in the beam.

The pencil beam deflection angle (i.e. the tilt angle of the electron beam) is denoted as a in FIG. 1. Due to the energy spread or dispersion within the pencil beam, there is a dispersion of electron speeds in the beam. As seen, the dispersion of speeds results in an angular spread or dispersion of $\Delta\alpha$ in the deflection angle. This is because the faster electrons are deflected by a lesser angle by the deflector 104, while the slower electrons are deflected by a greater angle by the deflector 104.

At the surface of the target substrate 106, which is shown as being positioned a distance L below a center of the deflector 104, the angular deflection causes the beam to land at a distance D away from the optical axis (the z-axis) of the electron beam column. In addition, the angular spread causes chromatic aberration on the surface of the target substrate. The full-width at half maximum of the chromatic aberration is denoted as $\Delta D$.

It turns out that the amount of chromatic aberration $\Delta D$ at the substrate surface depends on the beam energy E, the energy spread of the beam $\Delta E$, the deflector-surface distance L, the deflection angle α, and the type of deflector. The types of deflector considered include an electrostatic deflector and a magnetic deflector. The following calculations are done separately for an electrostatic deflector and for a magnetic deflector.

For an electrostatic deflection (denoted by a subscript "e"), the pencil beam deflection angle $\alpha_e$ is given as follows.

$$\alpha_e = C_e/V_a \quad \text{(Eq. 1)}$$

In the above Eq. 1, the $C_e$ is a constant of the electrostatic deflection system, and $V_a$ is the acceleration voltage of the electron beam (which is directly proportional to the beam energy E).

The energy dispersive angle $\Delta\alpha_e$ in the electrostatic deflection system may be defined in terms of the source energy spread, $\Delta E$, which is assumed to be much less than the beam energy, E (i.e. $\Delta E \ll E$). Applicants have determined that the energy dispersive angle may be approximated as follows.

$$\Delta\alpha_e \approx -\alpha_e \Delta E/V_a \quad \text{(Eq. 2)}$$

The energy dispersive angle, $\Delta\alpha_e$, may be considered as the angle between the trajectories of a nominal "slowest" electron and a nominal "fastest" electron in the source energy spread, $\Delta E$, where $\Delta E$ may be defined as the full-width at half maximum (FWHM) of the source energy distribution. Accordingly, the FWHM transfer chromatic aberration on the substrate surface, $\Delta D_e$, may be given as follows.

$$\Delta D_e \approx L \Delta\alpha_e \approx L \, \alpha_e \Delta E/V_a \quad \text{(Eq. 3)}$$

For example, consider the example where L=50 mm, $V_a$=1 kV, and $\Delta E$=0.6 eV, then, for a 10 degree tilt angle ($\alpha_e$=10 degrees). Using Eq. 3, the chromatic blur on the substrate surface becomes $\Delta D_e \approx 5.2$ microns.

For a magnetic deflection (denoted by a subscript "m"), the pencil beam deflection angle $\alpha_m$ is given as follows.

$$\alpha_m = C_m/V_a^{1/2} \quad \text{(Eq. 4)}$$

In the above Eq. 4, the $C_m$ is a constant of the magnetic deflection system.

The energy dispersive angle $\Delta\alpha_m$ in the magnetic deflection system may be defined in terms of the source energy spread, $\Delta E$, which is again assumed to be much less than the beam energy, E (i.e. $\Delta E \ll E$). Applicants have determined that the energy dispersive angle may be approximated as follows.

$$\Delta\alpha_m \approx -\alpha_m \Delta E/2V_a \quad \text{(Eq. 5)}$$

The energy dispersive angle, $\Delta\alpha_m$, may be considered again as the angle between the trajectories of a nominal "slowest" electron and a nominal "fastest" electron in the source energy spread, $\Delta E$, where $\Delta E$ may be defined as the FWHM of the source energy distribution. Accordingly, the FWHM transfer chromatic aberration on the substrate surface, $\Delta D_m$, may be given as follows.

$$\Delta D_m \approx L \Delta\alpha_m \approx L \alpha_m \Delta E/2V_a \quad \text{(Eq. 6)}$$

For example, consider the example where L=50 mm, $V_a$=1 kV, and $\Delta E$=0.6 eV, then, for a 10 degree tilt angle ($\alpha_e$=10 degrees). Using Eq. 6, the chromatic blur on the substrate surface becomes $\Delta D_m \approx 2.6$ microns.

The above approximated blur contributions are clearly unacceptably large for contemporary high-resolution SEM imaging. In fact, it is desirable to reduce these blur contributions by a factor of about a thousand (1000×) or more. Achieving such vast reductions is clearly a highly challenging task.

The present disclosure provides a novel and inventive tilt-imaging scanning electron microscope (SEM) for use as a CD-SEM, eDR, and other applications. The invented tilt-imaging SEM provides high-resolution imaging by effectively canceling the chromatic aberration caused by the tilt deflection.

Figure 2:
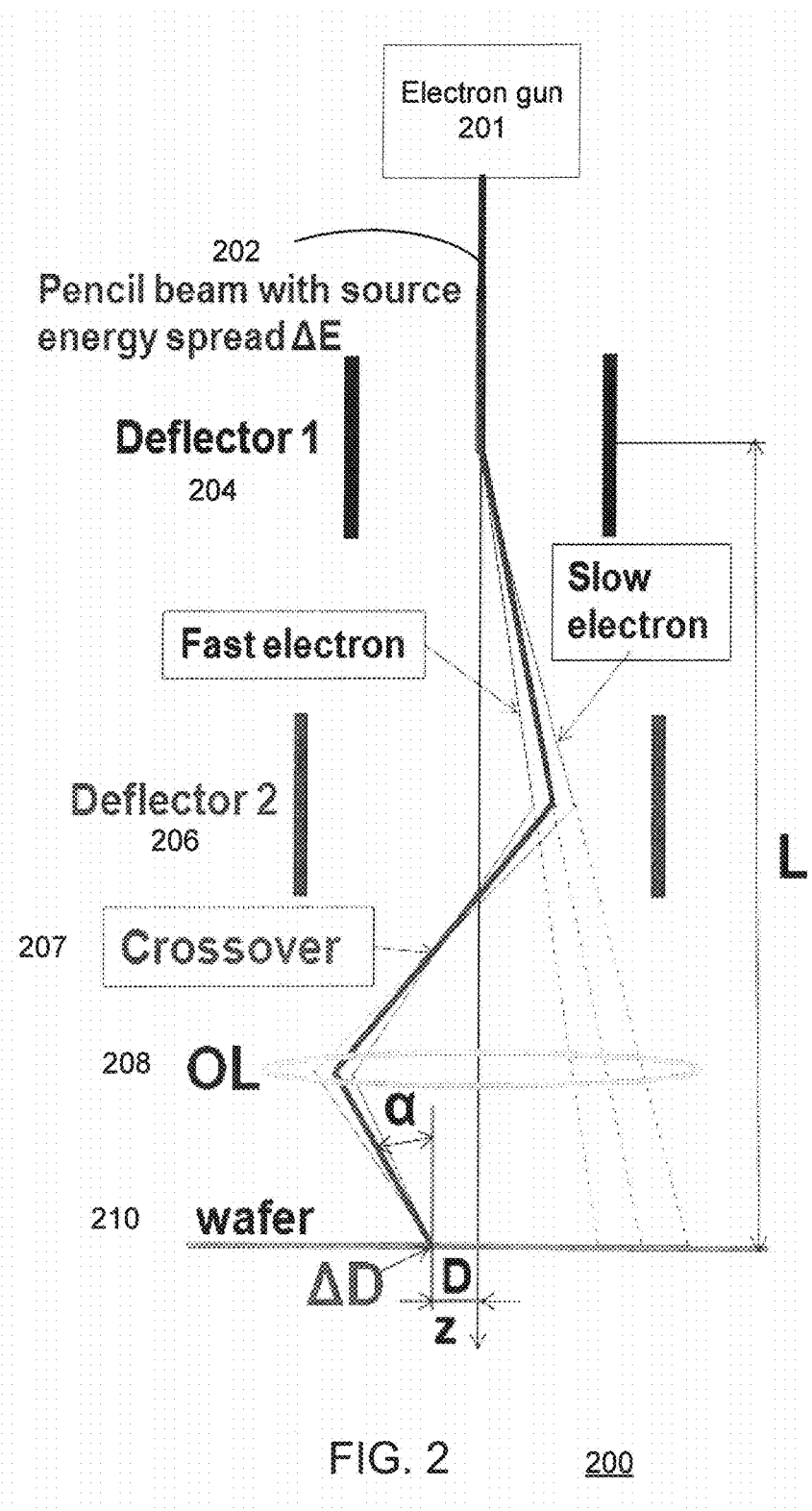
FIG. 2 depicts an e-beam deflection system for tilt-imaging in accordance with an embodiment of the invention.

FIG. 2 depicts an chromatic-aberration-cancelling e-beam deflection system 200 for tilt-imaging in accordance with an embodiment of the invention. As shown, an electron beam 202 may be generated by an electron gun 201 and condenser lenses (not shown). The electron beam 202 (which may be considered as a pencil beam for the purposes of determining the off-axis chromatic blur) is deflected by two deflectors, first in one direction by Deflector 1 204 and then in a different (opposite) direction by Deflector 2 206, and then focused by the objective lens (OL) 208 onto a beam spot on the surface of the wafer (or other substrate) 210.

The two deflectors (204 and 206) may be electrostatic, or magnetic, or a hybrid of electrostatic and magnetic. The objective lens 208 may be a combined-electrostatic-magnetic lens in which the electrostatic section may be used to retard the beam from the high acceleration energy ($V_a$) to the lower landing energy and to simultaneously charge the specimen, and the magnetic section may be used to focus the beam onto the specimen. In an exemplary embodiment, the magnetic section immerses the substrate surface in a magnetic field. Note that the position of the objective lens shown in FIG. 2 may correspond to the position of the pole piece gap for the magnetic section of the objective lens.

The electron beam, assumed here to be a pencil beam for purposes of focusing on the chromatic aberration, is energy dispersed after it is deflected by Deflector 1 204, as described above in relation to FIG. 1. As depicted, the slower electrons are deflected more than the faster electrons.

Deflector 2 206 strongly deflects the dispersed beam (including the slower and faster electrons) backwards towards the optical axis and also acts simultaneously to focus the dispersed beam. The focusing action occurs because the slower electrons (which are farther from the optical axis after the first deflection) are deflected more and the faster electrons (which are closer to the optical axis after the first deflection) are deflected less. Due to this focusing action, a beam crossover 207 is formed between Deflector 2 206 and the objective lens 208.

In accordance with an embodiment of the invention, the crossover 207 is imaged by the objective lens onto the substrate surface, and the electron beam is tilted (i.e. has a trajectory that is non-normal to the surface) when it lands on the substrate surface. The tilt angle α is shown and is measured relative to the normal vector for the substrate surface.

As depicted in FIG. 2, the landing position of the electron beam may be shifted by a distance D from the optical axis of the electron beam column. The source-energy dispersive blur $\Delta D$ at the surface may be minimized in the following manner.

Figure 3:
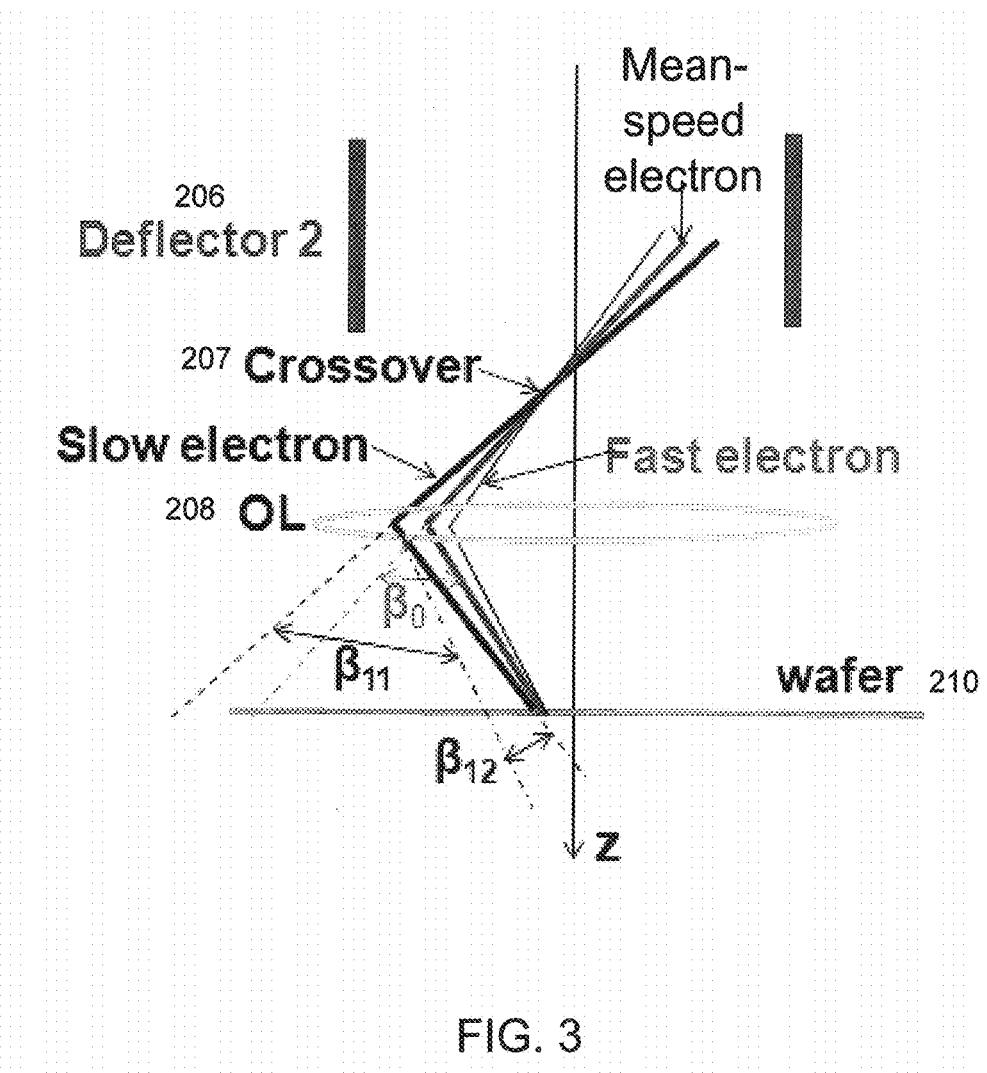
FIG. 3 illustrates a focusing principle for a source-energy-dispersed electron beam in accordance with an embodiment of the invention.

FIG. 3 illustrates a focusing principle for a source-energy-dispersed electron beam in accordance with an embodiment of the invention. As depicted, the OL focusing angle for the mean-speed electron is $\beta_0$, and the OL focusing angle for the "slow" electron is equal to $\beta_{11}$ plus $\beta_{12}$. The angle $\beta_{11}$ is greater than the angle $\beta_0$ because the trajectory slow electron is farther away from the axis than the trajectory of the mean-speed electron when the electrons enter the OL; hence, the OL has a stronger focusing strength or capability in relation to the slow electron. The additional angle $\beta_{12}$ is due to the fact that the slow electron also stays longer under the influence of the OL so the OL has a longer time to focus it. A similar analysis may be performed for the OL focusing angle of the "fast" electron. The end result is that the energy-dispersed electrons of the pencil beam may be focused onto a single point on the surface.

Applicants have determined that the position of the crossover 107 determines the tilt performance of the SEM instrument. The tilt performance may be considered as the relation between the total spot size (or resolution) and the tilt angle α of the beam. The total spot size may be determined as a quadratic summation of the axial spot size before tilting, the off-axis coma blur, and the off-axis chromatic blur resulting from the source-energy spread. The crossover position may be determined by the relative focusing strength and field rotation between Deflector 1 204 and Deflector 2 206.

Applicants have further determined that, given the relative strength and rotation of the two deflectors, there is one best crossover position at which the electrons in the energy-dispersed beam may be ideally focused together onto the specimen surface. From the inverse perspective, given a tilt angle α, there exists a best set of deflector conditions (i.e. the relative strength and rotation of the two deflectors) to achieve the best cancellation of chromatic blur.

To verify the chromatic blur cancellation principle discussed above, applicants have performed computer simulations and also experiments with electron beam instrumentation. In the simulations, two electrostatic deflectors are arranged in the manner shown in FIG. 2, and the voltage on Deflector 2 is fixed while the voltage on Deflector 1 is varied. The simulation results are shown in FIG. 4.

Figure 4:
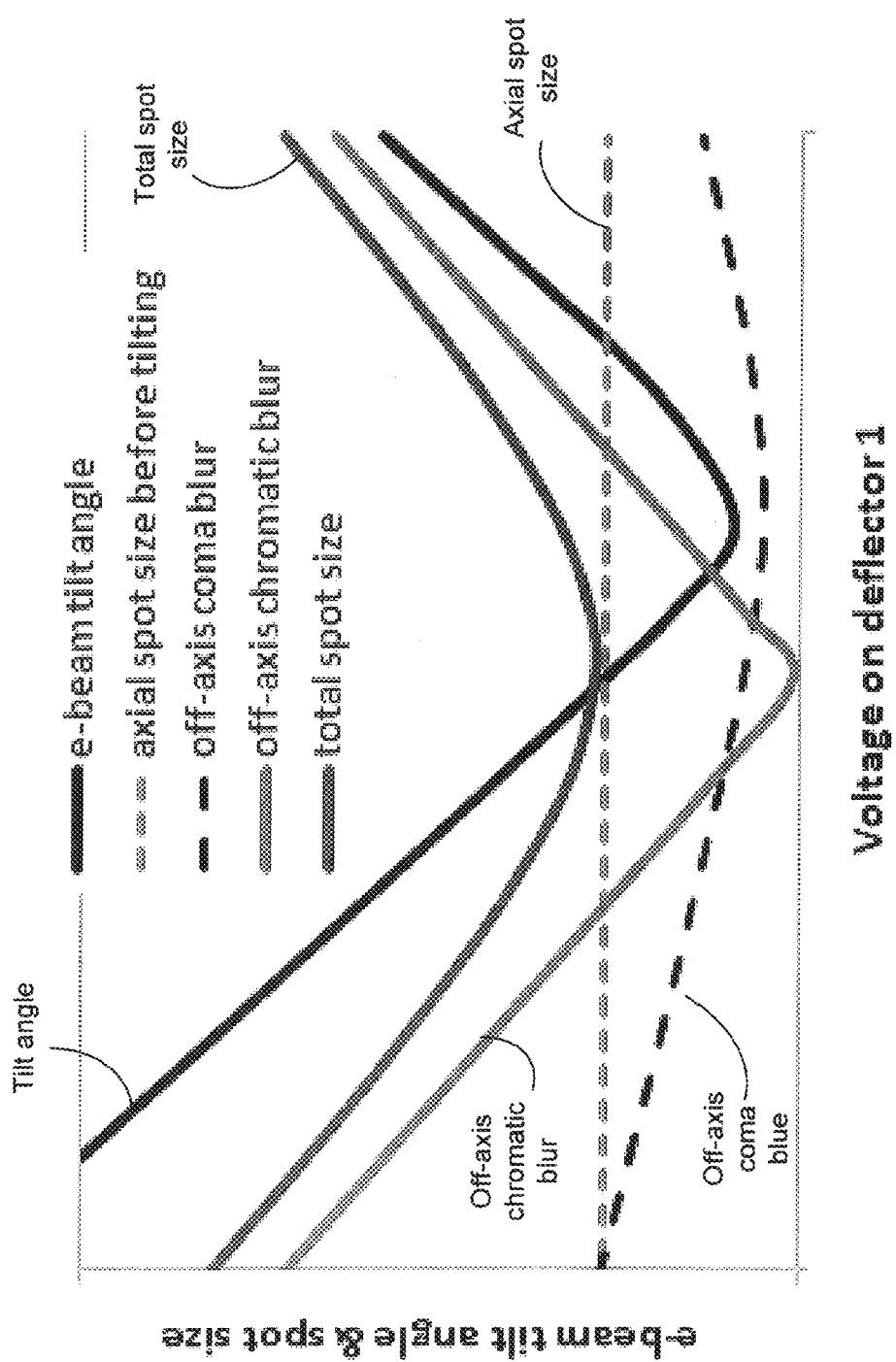
FIG. 4 is a graph of e-beam tilt angle and spot size contributions in accordance with an embodiment of the invention.

FIG. 4 is a graph of e-beam tilt angle and spot size contributions in accordance with an embodiment of the invention. The plots in FIG. 4 include the e-beam tilt angle, the axial spot size before tilting, the off-axis coma blur, the off-axis chromatic blur, and the total spot size. As shown, the total spot size is minimized approximately when the off-axis chromatic blur is minimized. As discussed above in relation to FIGS. 2 and 3, the off-axis chromatic blur is minimized by focusing the energy-dispersed beam so that off-axis (transfer) chromatic aberration is cancelled.

As shown in FIG. 4, there are two usable tilt performances that may be advantageously used in practice. These two usable tilt performances include: a configuration with the optimum tilt performance at the best chromatic cancellation; and configurations with favorable tilt performance close to the best chromatic cancellation.

First, let us consider the configuration with optimum tilt performance at the best chromatic cancellation. As seen in FIG. 4, the off-axis chromatic blur (transverse chromatic aberration) may be fully cancelled at one voltage on Deflector 1 (where the off-axis chromatic blur is minimized). At this point, the off-axis coma blur is also near minimum, and the total spot size is almost as small as the axial spot size before tilting, assuming that the off-axis astigmatism and field curvature are all corrected by the electron optics. At or around the best chromatic cancellation, the chromatic blur may be limited to an order of magnitude in the nanometer or sub-nanometer range.

However, the tilt angle may be relatively small at this point of best chromatic cancellation, and the voltages on Deflectors 1 and 2 need to be increased in an equal ratio in order to increase the tilt angle while maintaining the best chromatic cancellation. Such an increase in the electrostatic deflection voltages results, unfortunately, in a linear increase in the off-axis coma, which may eventually grow to dominate the spot size contributions.

Hence, let us now consider the configurations with favorable tilt performance close to the best chromatic cancellation. In FIG. 4, favorable tilt performance may be achieved at voltages lower than that for the best chromatic cancellation. As seen, at such lower voltages, the tilt angle increases, although the total spot size also increases somewhat (decreasing or degrading the resolution). For example, as depicted in FIG. 4, Deflector 1 may be configured with a strength of less than the voltage at which the transverse chromatic aberration is best cancelled (and Deflector 2 may be configured with a corresponding voltage) so as to achieve a tilt angle much greater than that at the best cancellation of the transverse chromatic aberration (although the total spot size is larger than the minimum achievable).

Figure 5:
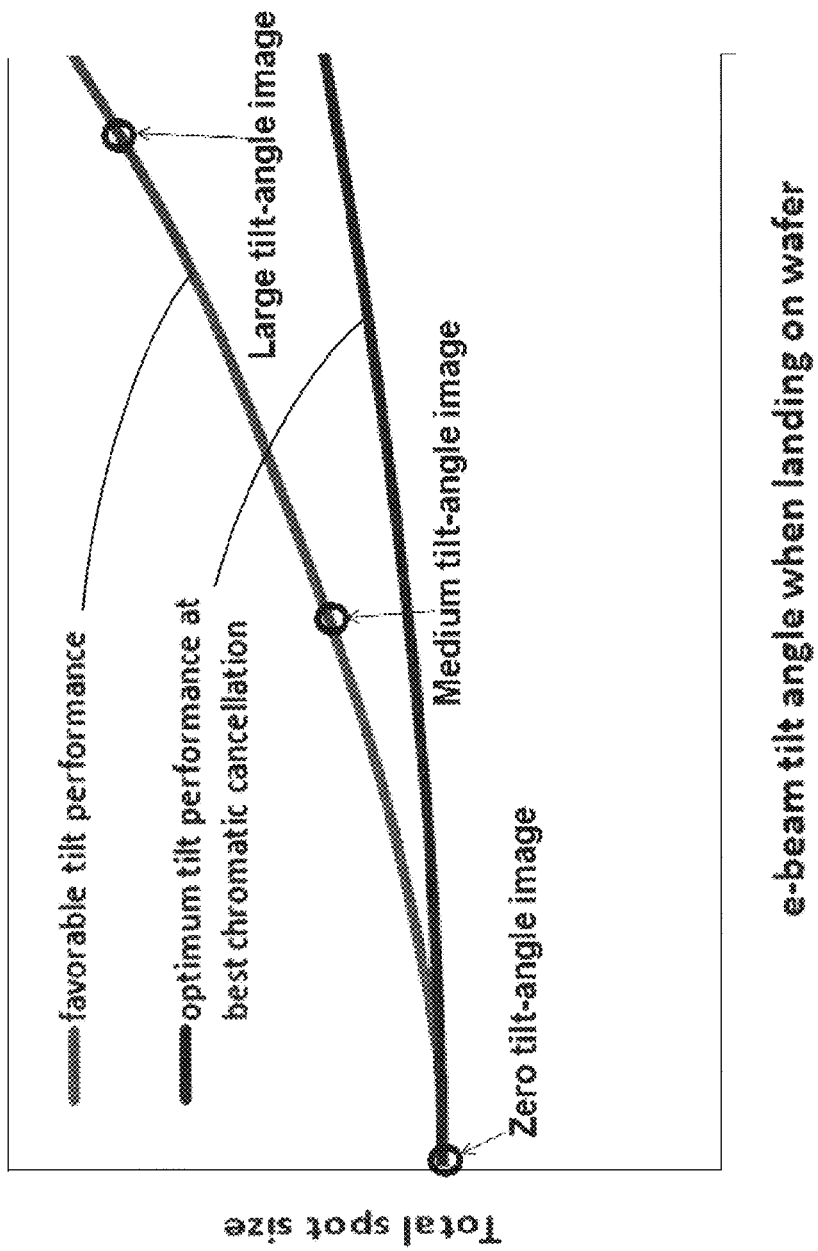
FIG. 5 is a graph of total spot size versus e-beam tilt angle using configurations for optimum and favorable tilt performance in accordance with an embodiment of the invention.

FIG. 5 is a graph of total spot size versus e-beam tilt angle using configurations for optimum and favorable tilt performance in accordance with an embodiment of the invention. As shown, an embodiment of the invention uses a configuration for favorable tilt performance to achieve medium tilt-angle and high tilt-angle imaging. The optimum tilt performance configuration requires large deflections for large tilt angles and so may be impractical depending on the instrument.

Note that, while FIG. 2 shows only the tilting of the beam by a polar tilt angle α in one azimuthal direction, the tilting of the beam may be accomplished in any azimuthal direction. In other words, the tilt beam with a polar angle α may be rotated (using octupole deflectors, for example) in an azimuthal angle range of 0 to 360 degrees, and the resultant secondary electrons may be detected by an appropriate multi-directional secondary electron detection system (i.e. a detection system that detects secondary electrons at multiple azimuthal angles or over a range of azimuthal angles).

Figure 6:
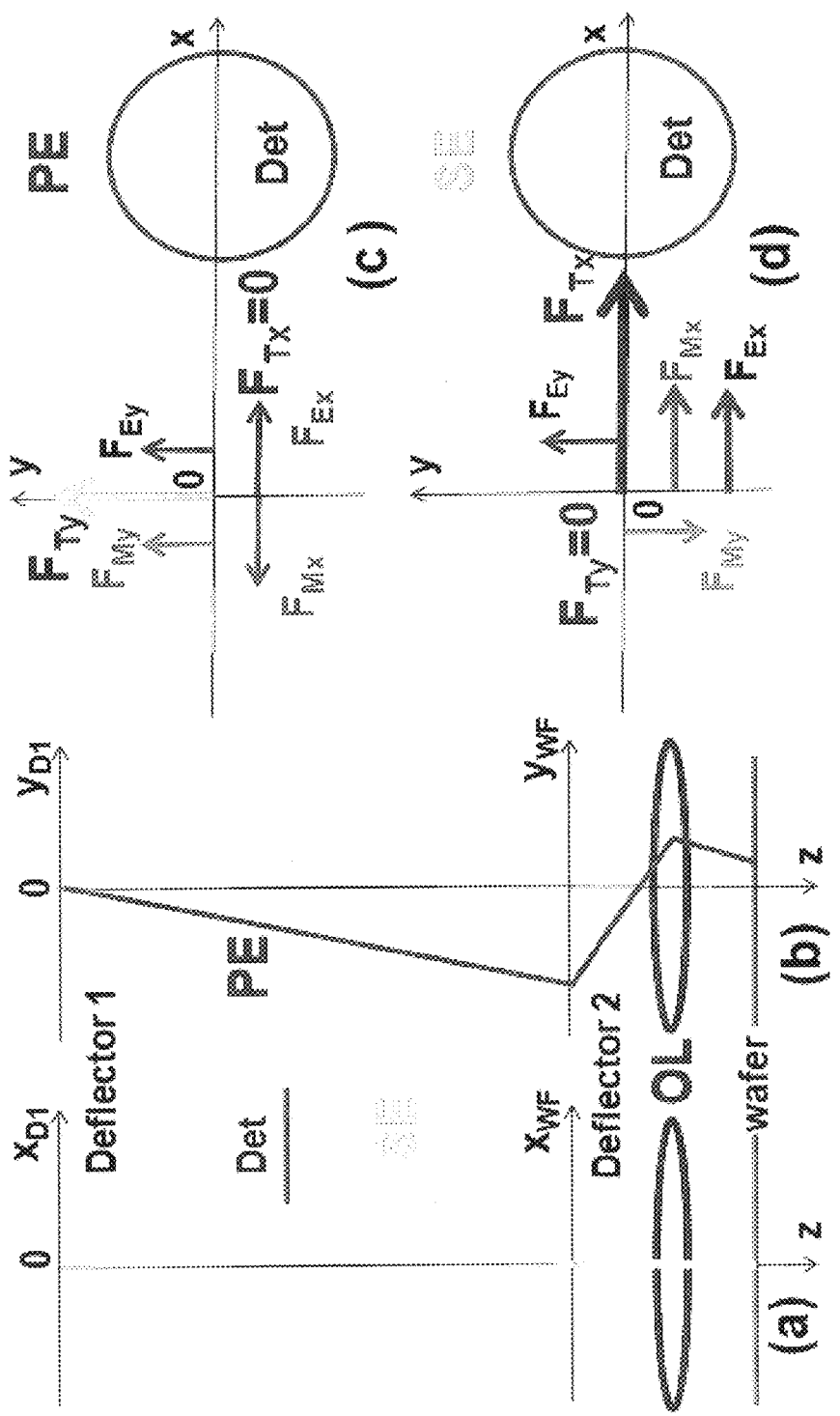
FIG. 6 provides schematic diagrams of a chromatic-blur-cancelling e-beam deflection system for tilt-imaging that uses a Wien filter in accordance with an alternate embodiment of the invention.

However, if the secondary electron detector is in a fixed direction (for instance, in the +x direction shown in FIG. 6A, then tilting in a range of azimuthal angles may still be accomplished using an alternate embodiment of the invention which employs a Wien filter in place of Deflector 2. FIGS. 6A-6D are schematic diagrams of a chromatic-blur-cancelling e-beam deflection system for tilt-imaging that uses a Wien filter in accordance with this alternate embodiment of the invention. In the particular configuration illustrated by the diagrams in FIG. 6, the tilt-imaging is performed from the y+ (positive y) direction, while the detector (Det) is in the x+ direction.

Diagrams labeled (a) and (b) of FIG. 6 depict the trajectories of the secondary electrons (SE) and the primary electrons (PE), respectively. Diagrams labeled (c) and (d) of FIG. 6 depict the forces due to the Wien filter on the primary electrons and secondary electrons, respectively.

As shown in diagram (c) of FIG. 6, the Wien filter creates equal magnitude and opposite direction electrostatic ($F_{Ex}$) and magnetic ($F_{Mx}$) forces on the PE in the x-direction. On the other hand, Wien filter creates two equal magnitude and same direction electrostatic ($F_{Ey}$) and magnetic ($F_{My}$) forces on the PE in the y– direction. As a result, the total force on the PE due to the Wien filter is $F_{Ty}=F_{Ey}+F_{My}$ in the y+ direction. This force thus deflects the PE in the y+ ($y_{WF}$) direction by the Wien filter, as shown in diagram (b) of FIG. 6.

As shown in diagram (d) of FIG. 6, the Wien filter creates equal magnitude and opposite direction electrostatic ($F_{Ey}$) and magnetic ($F_{My}$) forces on the SE in the y-direction. On the other hand, Wien filter creates two equal magnitude and same direction electrostatic ($F_{Ex}$) and magnetic ($F_{Mx}$) forces on the PE in the x– direction. As a result, the total force on the SE due to the Wien filter is $F_{Tx}=F_{Ex}+F_{Mx}$ in the x+ direction. This force thus deflects the SE in the x+ ($X_{WF}$) direction by the Wien filter, as shown in diagram (a) of FIG. 6.

For creating a tilt image from the y– (negative y) direction, the force polarities of the Wien filter are reversed in the y-direction and kept the same in the x direction. The trajectory of the PE for the tilt image from the y– direction is labeled Ty– in diagram (b) of FIG. 7. In comparison, the trajectory of the PE for the tilt image from the y+ direction is labeled Ty+ in diagram (b) of FIG. 7.

To form tilt images from the x+ or x− directions, the Wien filter forces in the y-direction are not necessary. This simplifies the operation.

For creating the x+ tilt image, only the electrostatic force in the x+ (positive x) direction ($F_{Ex}$) is needed, and the magnetic force in the x− direction is not required. The force $F_{Ex}$ may be used to conduct the x+ tilting to deflect the SE in the x+ direction to the detector. The trajectory for the PE for the tilt image from the x+ direction is labeled Tx+ in diagram (a) of FIG. 7.

For creating the x− tilt image, only the magnetic force in the x− (negative x) direction ($F_{Mx}$) is needed, and the electrostatic force in the x+ direction is not required. The force $F_{Mx}$ may be used to conduct the x− tilting for the PE and to deflect the SE in the x+ direction to the detector. The trajectory for the PE for the tilt image from the x− direction is labeled Tx− in diagram (a) of FIG. 7.

Figure 7:
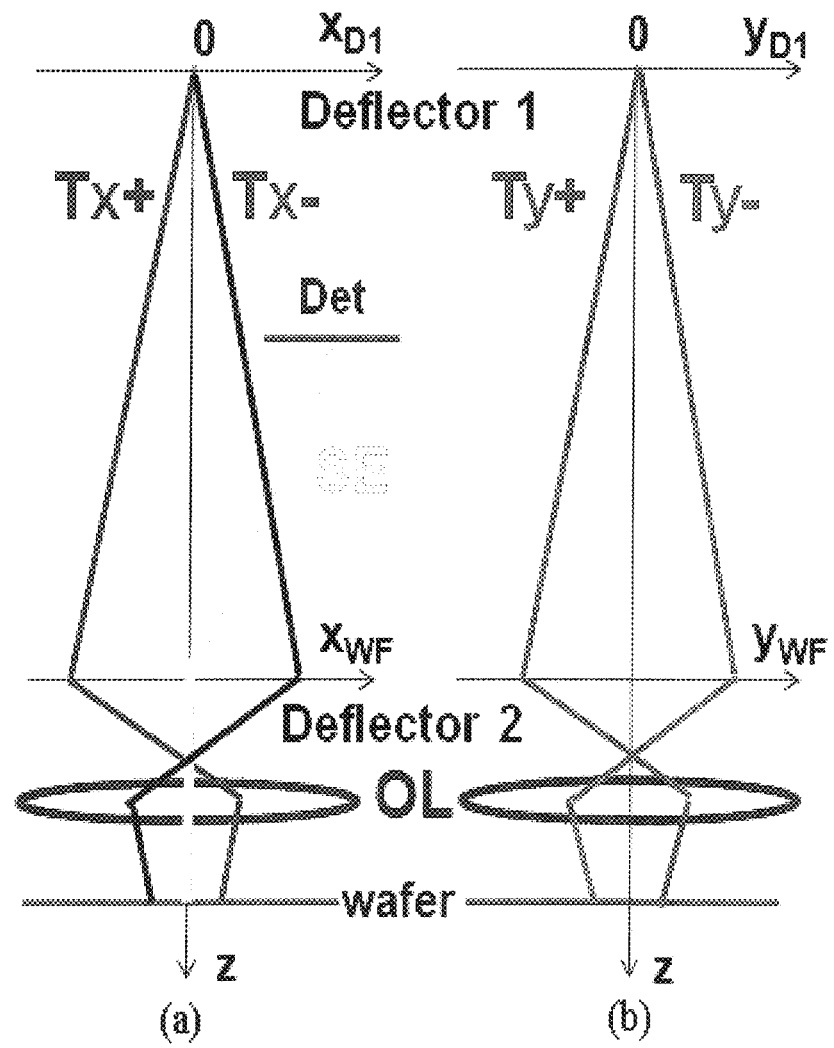
FIG. 7 provides schematic diagrams depicting the formation of four directional tilt images in accordance with an embodiment of the invention.

With one Wien filter (for Deflector 2) and one fixed detector, the above-described FIGS. 6 and 7 provide a method to form the polar-tilt images when the azimuth angle is 0, 90, 180 and 270 degrees. We further present below a method to expand the tilt images to cover various azimuthal angle ranges. The method makes use of the electrostatic and magnetic sections of the Wien filter to form tilt images at azimuthal angles of 0 degrees±A degrees, 90 degrees±A degrees, 180 degrees±A degrees, and 270 degrees±A degrees, where A is a variable number of degrees.

Figure 8:
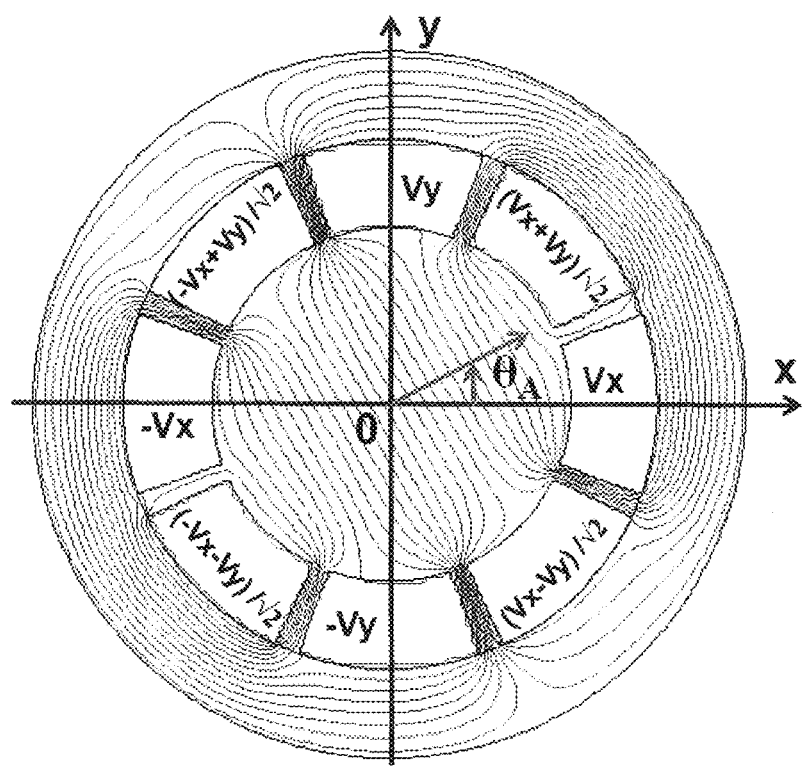
FIG. 8 depicts a plan view of an octupole electrostatic deflector with a uniform deflection field rotated to the direction of $\theta_A$ in accordance with an embodiment of the invention.

The electrostatic section of the Wien filter (Deflector 2) is an electrostatic deflector. In accordance with an embodiment of the invention, for creating a uniform deflection field, an octupole electrostatic deflector 800 may be used, such as depicted in FIG. 8. The deflection field of the octupole electrostatic deflector 800 may be controllably rotated to an angle of $\theta_A$ with respect to x+ axis. In order to achieve the electrostatic field rotation of angle $\theta_A$, then the relationship between the voltages applied on the plates of the deflector are given by the following equation (Eq. 7).

$$Vy = Vx * \tan(\theta_A) \quad \text{(Eq. 7)}$$

For the example of $\theta_A$=15 degrees, Vy is equal to 0.268*Vx. All the voltages on the eight plates may thus be set by following the signs on the plates in FIG. 8, such that a uniform deflection field at $\theta_A$=15 degrees is created, as shown with the equi-potential lines in FIG. 8.

The magnetic section of the Wien filter (Deflector 2) may be formed, in one embodiment, using a magnetic quadrupole. For example, the magnetic quadrupole may have two pairs of copper coils arranged in x-axis and y-axis separately. The currents Ix and Iy in such a magnetic quadruple may be used to control the magnetic flux density in x-axis and y-axis, respectively. The magnetic field of a Wien filter may be rotated by an angle of $\theta_A$ if the relationship between coil currents Ix and Iy are according to the following equation (Eq. 8).

$$Iy = Ix * \tan(\theta_A) \quad \text{(Eq. 8)}$$

In one embodiment, Deflector 1 may be either an electrostatic octupole or a magnetic quadrupole. The deflection field of Deflector 1 may also be rotated to an angle of $\theta_A$ if the voltages on the octupole plates or the currents through the magnetic quadruple coils are as given in the manners of Eq. 7 or Eq. 8, respectively.

Figure 9:
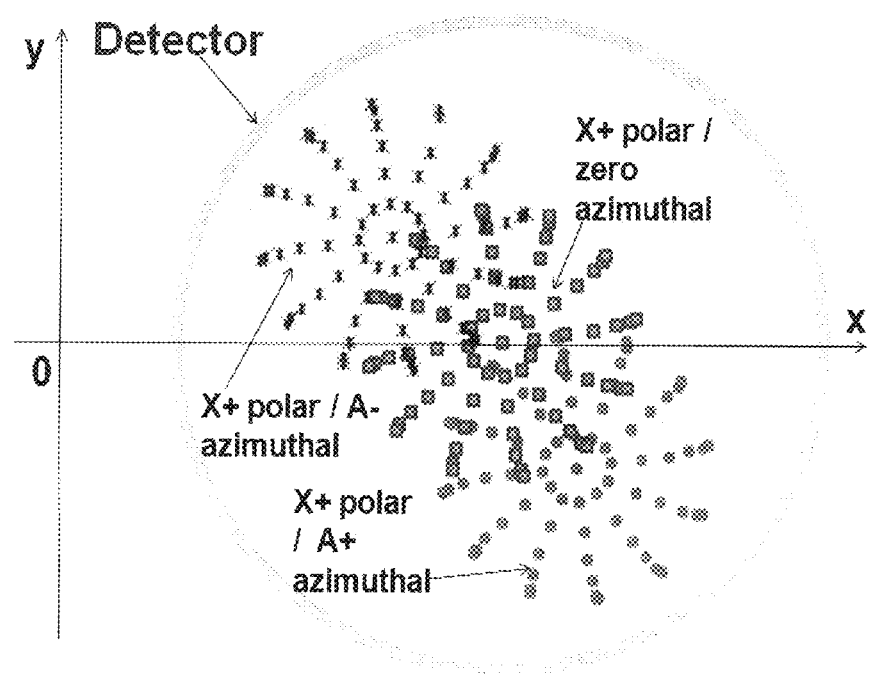
FIG. 9 depicts simulations of secondary electron collections for polar-tilt imaging together with three azimuth angles in accordance with an embodiment of the invention.

Hence, in accordance with an embodiment of the invention, an azimuth tilt-image with an angle of A=$\theta_A$ may be formed by rotating the deflection fields in the Deflector 1 and the Wien filter (Deflector 2) all with the same angle of $\theta_A$. The maximum azimuth angle A is determined by the secondary electron (SE) collection optics, for which all SEs should be collected by the detector, as can be exhibited in FIG. 9. In FIG. 9, the SEs are collected in the center area and two-opposite side-area of the detector for a polar-tilt imaging with a zero azimuth-angle, a positive azimuth-angle (A+) and a negative azimuth-angle (A−).

Conclusion

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A tilt-imaging scanning electron microscope apparatus, the apparatus comprising:
    an electron gun for generating an electron beam along an optical axis of an electron beam column, wherein the electron beam includes a source-energy dispersion;
    a first deflector for deflecting the electron beam away from the optical axis;
    a second deflector for deflecting the electron beam back towards the optical axis, wherein the second deflector is configured such that a crossover of slow and fast electrons in the electron beam is formed at a position off the optical axis between the second deflector and the objective lens;
    an objective electron lens configured to image the crossover onto a spot displaced from the optical axis on a surface of a target substrate so as to generate secondary electrons, wherein the electron beam lands on the surface at a tilt angle; and
    a detector for detecting the secondary electrons.

2. The apparatus of claim 1, wherein the first and second deflectors comprise electrostatic deflectors.

3. The apparatus of claim 1, wherein the first and second deflectors comprise magnetic deflectors.

4. The apparatus of claim 1, wherein the objective lens comprises a magnetic section that is used to focus the electron beam onto the surface.

5. The apparatus of claim 4, wherein the magnetic section immerses the surface in a magnetic field.

6. The apparatus of claim 4, wherein the objective lens further comprises an electrostatic section that retards a speed of the electron beam before the electron beam reaches the surface.

7. The apparatus of claim 1, wherein the tilt angle is relative to a normal vector for the surface, and wherein the tilt angle is non-zero.

8. The apparatus of claim 1, wherein the first and second deflectors and the objective lens are configured to minimize an off-axis chromatic blur at the surface.

9. The apparatus of claim 1, wherein the first and second deflectors are configured with deflections that result in a non-minimal off-axis chromatic blur at the surface in order to achieve a tilt angle that is greater than a tilt angle at a minimal off-axis chromatic blur.

10. The apparatus of claim 1, wherein the second deflector comprises a Wien filter.

11. The apparatus of claim 10, wherein the detector is at a fixed position, and wherein the tilt angle is configurable to four directions separated by ninety degrees.

12. The apparatus of claim 10, wherein the Wien filter comprises an electrostatic octupole section and a magnetic quadrupole section.

13. The apparatus of claim 12, wherein the first deflector comprises an electrostatic octupole section or a magnetic quadrupole section.

14. The apparatus of claim 13, wherein the first deflector and the Wien filter are configured to deflect the electron beam by a same rotation angle.

15. A method of imaging a surface of a target substrate using an electron beam with a trajectory tilted relative to a substrate surface, the method comprising:

generating an electron beam along an optical axis of an electron beam column, wherein the electron beam includes a source-energy dispersion;

a first deflection by a first deflector of the electron beam away from the optical axis;

a second deflection by a second deflector of the electron beam back towards the optical axis;

forming a crossover of slow and fast electrons in the electron beam at a position off the optical axis between the second deflector and an objective lens;

imaging the crossover onto the surface of the target substrate by focusing the electron beam after the second deflection onto a spot displaced from the optical axis on a surface of a target substrate by so as to generate secondary electrons, wherein the electron beam lands on the surface at a tilt angle; and detecting the secondary electrons.

16. The method of claim 15 further comprising:
immersing the surface of the target substrate in a magnetic field.

17. The method of claim 15 further comprising:
minimizing an off-axis chromatic blur at the surface.

18. The method of claim 15, wherein a non-minimal off-axis chromatic blur is used to achieve a tilt angle that is greater than a tilt angle at a minimal off-axis chromatic blur.

19. The method of claim 15, wherein the second deflection is performed by a Wien filter.

* * * * *